United States Patent
Kumazawa et al.

(10) Patent No.: US 11,577,339 B2
(45) Date of Patent: Feb. 14, 2023

(54) OPTICAL AXIS ADJUSTING METHOD FOR LASER PROCESSING APPARATUS

(71) Applicant: DISCO CORPORATION, Tokyo (JP)

(72) Inventors: Satoshi Kumazawa, Tokyo (JP); Masatoshi Nayuki, Tokyo (JP)

(73) Assignee: DISCO CORPORATION, Tokyo (JP)

(*) Notice: Subject to any disclaimer, the term of this patent is extended or adjusted under 35 U.S.C. 154(b) by 336 days.

(21) Appl. No.: 16/879,847

(22) Filed: May 21, 2020

(65) Prior Publication Data

US 2020/0368845 A1 Nov. 26, 2020

(30) Foreign Application Priority Data

May 23, 2019 (JP) .............................. JP2019-097059

(51) Int. Cl.
*B23K 26/064* (2014.01)
*B23K 26/70* (2014.01)
(Continued)

(52) U.S. Cl.
CPC .......... *B23K 26/064* (2015.10); *B23K 26/043* (2013.01); *B23K 26/402* (2013.01);
(Continued)

(58) Field of Classification Search
CPC ............ B23K 26/0853; B23K 2101/40; B23K 26/40; B23K 2103/50; B23K 26/032;
(Continued)

(56) References Cited

U.S. PATENT DOCUMENTS

2007/0145025 A1 6/2007 Yamazaki et al.
2008/0061044 A1* 3/2008 Murata ............. B23K 26/0736
219/121.73
(Continued)

FOREIGN PATENT DOCUMENTS

DE 4036127 A1 5/1991
JP 2005118815 A 5/2005
(Continued)

OTHER PUBLICATIONS

Search report issued in counterpart Singapore patent application No. 10202004805X, dated Jun. 17, 2021.
(Continued)

*Primary Examiner* — Chris Q Liu
(74) *Attorney, Agent, or Firm* — Greer Burns & Crain, Ltd.

(57) ABSTRACT

An optical axis adjusting method includes a position detecting step of emitting a laser beam from a laser oscillator, applying the laser beam to a processing point, and detecting the position of the laser beam by using a position detecting unit set at the processing point, a storing step of storing the position of the laser beam as detected in the position detecting step as a reference position, and an adjusting step of operating an adjusting mechanism of each optical component holder in the case that the position of the laser beam is deviated from the reference position after performing maintenance of each optical component, thereby adjusting the position of the laser beam so that the position of the laser beam is shifted back to the reference position.

14 Claims, 7 Drawing Sheets

(51) Int. Cl.
  *B23K 26/04* (2014.01)
  *G01M 11/08* (2006.01)
  *H01L 21/67* (2006.01)
  *H01L 21/683* (2006.01)
  *B23K 26/402* (2014.01)
  *B23K 26/57* (2014.01)

(52) U.S. Cl.
  CPC ............ *B23K 26/57* (2015.10); *B23K 26/705* (2015.10); *G01M 11/08* (2013.01); *H01L 21/67092* (2013.01); *H01L 21/67259* (2013.01); *H01L 21/6836* (2013.01); *H01L 21/6838* (2013.01); *H01L 2221/68327* (2013.01)

(58) Field of Classification Search
  CPC .... B23K 26/382; B23K 26/53; B23K 26/046; B23K 26/0622; B23K 26/0876; B23K 2103/56; B23K 26/03; B23K 26/064; B23K 26/067; B23K 26/082; B23K 26/0869; B23K 2103/172; B23K 26/0006; B23K 26/04; B23K 26/0626; B23K 26/0643; B23K 26/0648; B23K 26/0665; B23K 26/073; B23K 26/0736; B23K 26/083; B23K 26/364; B23K 26/38; B23K 10/00; B23K 20/10; B23K 2103/16; B23K 2103/52; B23K 26/00; B23K 26/02; B23K 26/034; B23K 26/035; B23K 26/06; B23K 26/062; B23K 26/0624; B23K 26/0673; B23K 26/0676; B23K 26/08; B23K 26/0821; B23K 26/0823; B23K 26/0884; B23K 26/355; B23K 26/361; B23K 26/384; B23K 26/389; B23K 26/402; B23K 26/50; B23K 26/55; B23K 26/57; B23K 26/702; H01L 21/78; H01L 21/268; H01L 21/67092; H01L 21/76; H01L 21/30; H01L 21/304; H01L 21/3043; H01L 21/3221; H01L 21/486; H01L 21/67132; H01L 21/67253; H01L 21/67259; H01L 21/67282; H01L 21/68; H01L 21/681; H01L 21/6836; H01L 21/68728; H01L 21/768; H01L 21/76802; H01L 21/76805; H01L 21/76898; H01L 2221/68318; H01L 2221/68327; H01L 2221/6834; H01L 2221/68386; H01L 2223/5446; H01L 23/544; H01L 33/0095
  USPC ............ 219/121.73, 121.67, 121.72, 121.82, 219/121.83, 121.6, 121.61, 121.62, 219/121.68, 121.7, 121.75, 121.78, 121.8
  See application file for complete search history.

(56) References Cited

U.S. PATENT DOCUMENTS

| | | | |
|---|---|---|---|
| 2008/0205458 A1* | 8/2008 | Kobayashi | H01L 21/67092 372/25 |
| 2008/0217301 A1* | 9/2008 | Nomaru | B23K 26/06 219/121.8 |
| 2009/0127233 A1* | 5/2009 | Asano | B23K 26/032 219/121.7 |
| 2009/0291544 A1* | 11/2009 | Watanabe | B23K 26/046 219/121.73 |
| 2011/0290769 A1* | 12/2011 | Furuta | B23K 26/40 219/121.72 |
| 2013/0068740 A1* | 3/2013 | Nomaru | B23K 26/0853 219/121.78 |
| 2013/0134142 A1* | 5/2013 | Morikazu | B23K 26/073 219/121.75 |
| 2014/0322847 A1* | 10/2014 | Endo | B23K 26/40 438/33 |
| 2015/0259235 A1* | 9/2015 | Takeda | B23K 26/0006 65/112 |
| 2015/0343559 A1* | 12/2015 | Morikazu | C03B 33/082 65/112 |
| 2017/0250102 A1* | 8/2017 | Yoshino | H01L 21/67092 |
| 2018/0299786 A1* | 10/2018 | Koerwer | H01L 21/67282 |
| 2018/0304402 A1* | 10/2018 | Furuta | G01B 7/02 |
| 2019/0084089 A1 | 3/2019 | Igasaki et al. | |

FOREIGN PATENT DOCUMENTS

| | | |
|---|---|---|
| JP | 2007275912 A | 10/2007 |
| JP | 2011173141 A | 9/2011 |
| JP | 2017163079 A | 9/2017 |

OTHER PUBLICATIONS

Search report issued in counterpart German patent application No. 10 2020 206 407.5, dated Jul. 6, 2022.

\* cited by examiner

OPTICAL AXIS ADJUSTING METHOD FOR LASER PROCESSING APPARATUS

BACKGROUND OF THE INVENTION

Field of the Invention

The present invention relates to an optical axis adjusting method for a laser processing apparatus.

Description of the Related Art

Conventionally known is a laser processing apparatus for dividing a semiconductor wafer into individual device chips by applying a laser beam to the semiconductor wafer to form laser processed grooves or modified layers and then dividing the semiconductor wafer along these laser processed grooves or modified layers (see Japanese Patent Laid-Open No. 2007-275912 and Japanese Patent Laid-Open No. 2017-163079, for example).

SUMMARY OF THE INVENTION

In general, a conventional laser processing apparatus includes a laser oscillator for generating a laser beam and a plurality of optical components such as mirrors and lenses for guiding the laser beam generated from the laser oscillator to a processing point where a workpiece is to be processed by the laser beam. The laser beam is focused by a focusing lens as one of the plural optical components and then applied to the workpiece.

In the case that contamination or burning occurs on the optical components included in the laser processing apparatus due to the laser beam, the occurrence of contamination or burning may cause a reduction in power of the laser beam or a distortion in beam shape of the laser beam. Accordingly, there is a possibility that the workpiece cannot be desirably processed to cause defective processing.

To determine the cause of such defective processing, the optical components must be removed to be checked one by one, and maintenance such as cleaning and replacement must be performed. However, when the optical components are removed once, the optical axis in the laser processing apparatus is deviated, so that it is necessary to perform a troublesome operation for adjusting the optical axis, thus causing an increase in number of man-hours.

It is therefore an object of the present invention to provide an optical axis adjusting method for a laser processing apparatus which can suppress the number of man-hours required for the adjustment of the optical axis in the laser processing apparatus.

In accordance with an aspect of the present invention, there is provided an optical axis adjusting method for a laser processing apparatus including a laser beam applying unit, the laser beam applying unit including a laser oscillator for oscillating a laser and emitting a laser beam, a plurality of optical components for guiding the laser beam generated from the laser oscillator to a processing point where a workpiece is to be processed by the laser beam, a plurality of optical component holders for holding the plurality of optical components, respectively, each optical component holder having an adjusting mechanism for adjusting a position of the laser beam, and a position detecting unit adapted to be provided at the processing point for detecting the position of the laser beam, the optical axis adjusting method including a position detecting step of emitting the laser beam from the laser oscillator, applying the laser beam to the processing point, and detecting the position of the laser beam by using the position detecting unit set at the processing point, a storing step of storing the position of the laser beam as detected in the position detecting step as a reference position, and an adjusting step of operating the adjusting mechanism of each optical component holder in the case that the position of the laser beam is deviated from the reference position after performing maintenance of each optical component, thereby adjusting the position of the laser beam so that the position of the laser beam is shifted back to the reference position.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
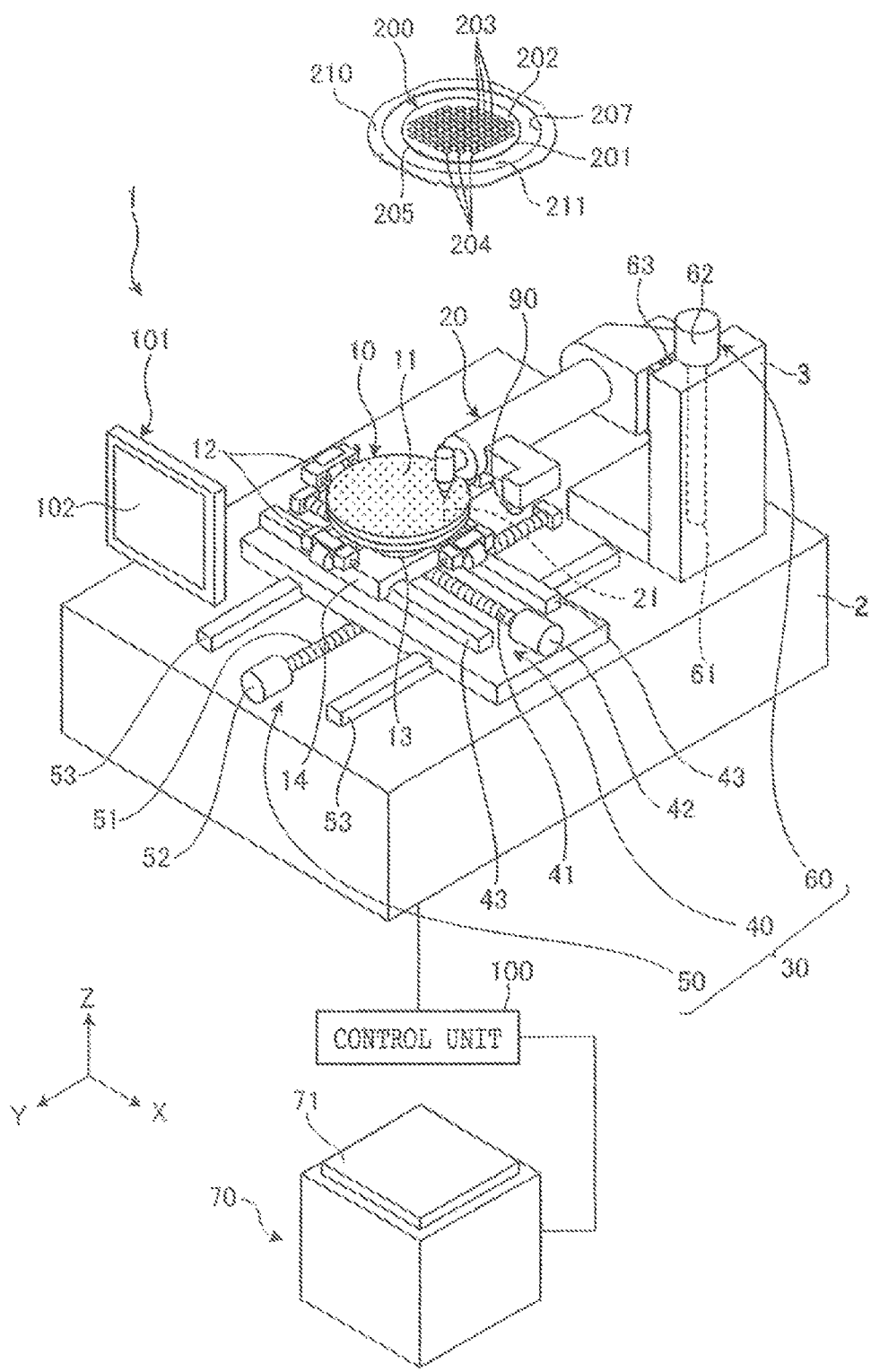
FIG. 1 is a perspective view depicting the configuration of a laser processing apparatus for use in performing an optical axis adjusting method according to a preferred embodiment of the present invention.
Figure 2:
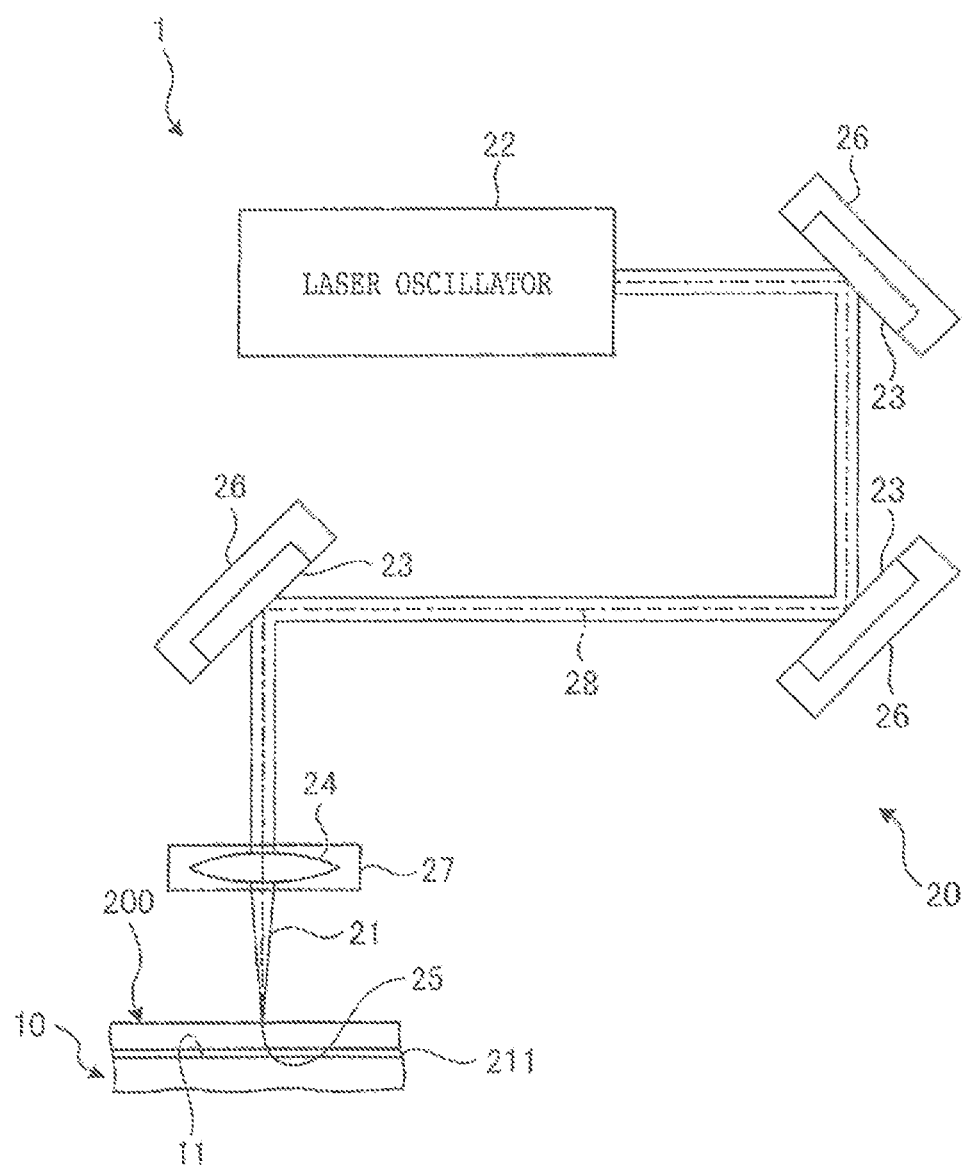
FIG. 2 is a schematic diagram depicting the configuration of a laser beam applying unit included in the laser processing apparatus depicted in FIG. 1.
Figure 3:
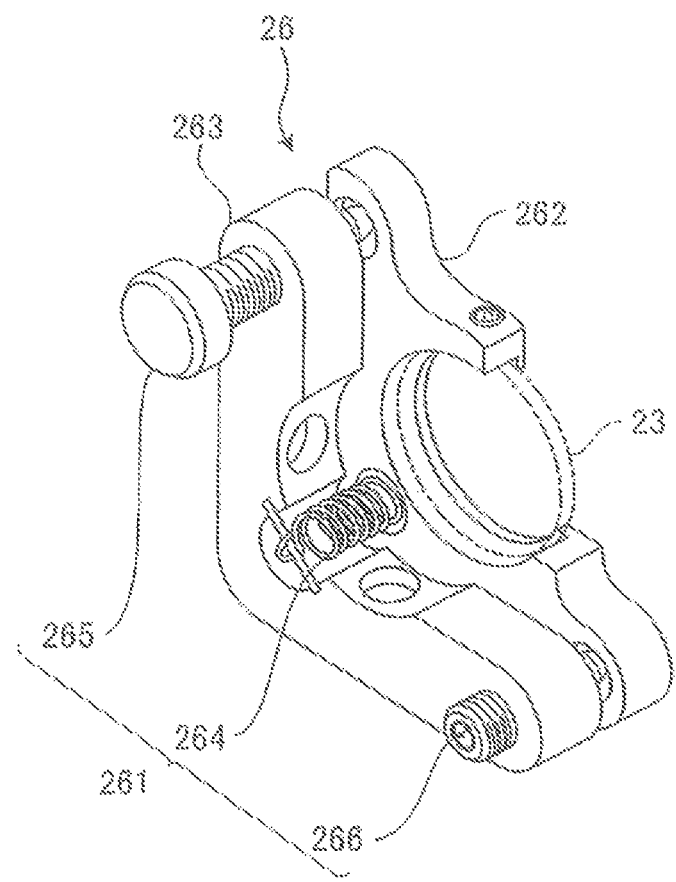
FIG. 3 is a perspective view depicting the configuration of a mirror holder included in the laser beam applying unit depicted in FIG. 2.
Figure 4:
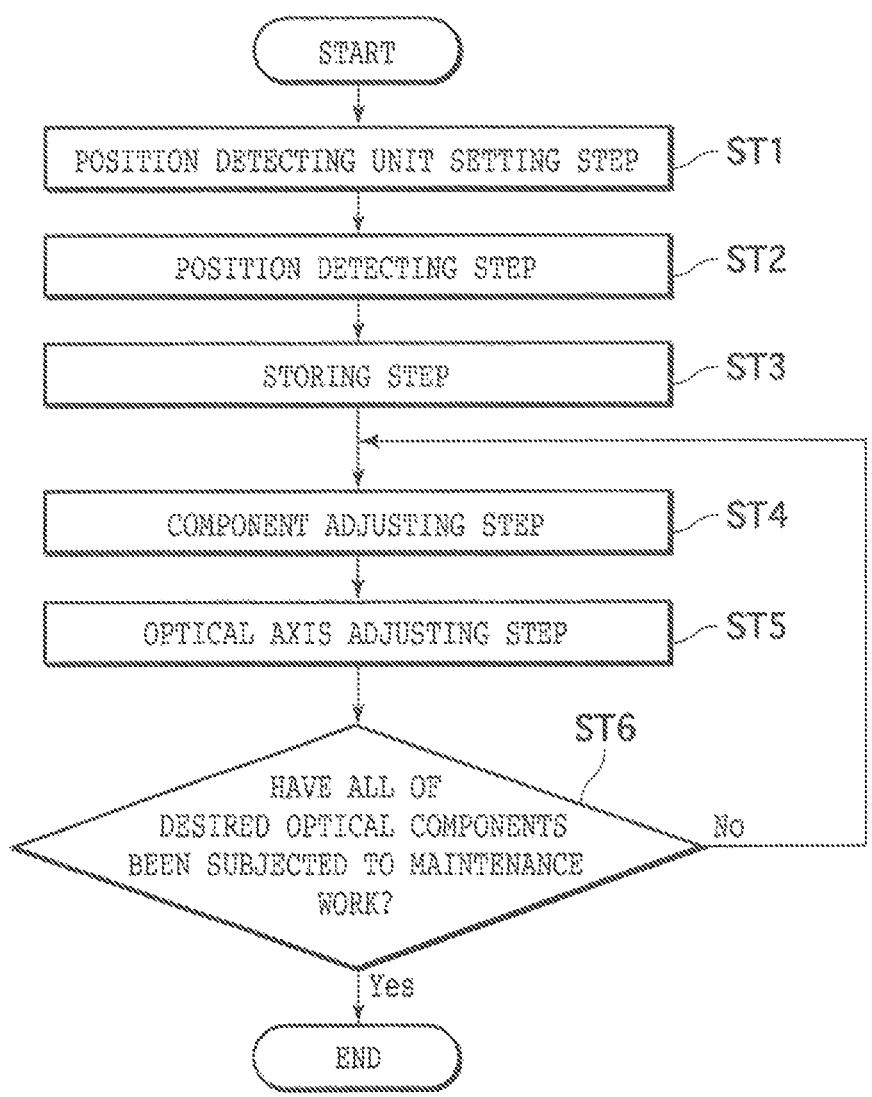
FIG. 4 is a flowchart depicting the flow of the optical axis adjusting method according to this preferred embodiment.

There will now be described an optical axis adjusting method for a laser processing apparatus according to a preferred embodiment of the present invention with reference to the drawings. FIG. 1 is a perspective view depicting the configuration of a laser processing apparatus 1 for use in performing the optical axis adjusting method according to this preferred embodiment. FIG. 2 is a schematic diagram depicting the configuration of a laser beam applying unit 20 included in the laser processing apparatus 1 depicted in FIG. 1. FIG. 3 is a perspective view depicting the configuration of a mirror holder 26 included in the laser beam applying unit 20 depicted in FIG. 2. FIG. 4 is a flowchart depicting the flow of the optical axis adjusting method according to this preferred embodiment.

The optical axis adjusting method according to this preferred embodiment is performed in the laser processing apparatus 1 depicted in FIG. 1. The laser processing apparatus 1 depicted in FIG. 1 is an apparatus for applying a pulsed laser beam 21 to a workpiece 200, thereby laser-processing the workpiece 200.

(Workpiece)

The workpiece 200 as a target to be processed by the laser processing apparatus 1 depicted in FIG. 1 is a disk-shaped semiconductor wafer or optical device wafer having a substrate 201 formed of silicon, sapphire, or gallium arsenide, for example. As depicted in FIG. 1, the substrate 201 of the workpiece 200 has a front side 202 and a back side 205 opposite to the front side 202. A plurality of crossing division lines 203 are set on the front side 202 of the substrate 201 to thereby define a plurality of separate regions where a plurality of devices 204 are respectively formed. That is, the workpiece 200 has the plural devices 204 on the front side 202 so that the plural devices 204 are separated from each other by the division lines 203. For example, each device 204 is an integrated circuit such as integrated circuit (IC) and large scale integrated circuit (LSI) or an image sensor such as charge coupled device (CCD) and a complementary metal oxide semiconductor (CMOS).

The back side 205 of the substrate 201 of the workpiece 200 (i.e., the back side of the workpiece 200) is attached to a circular adhesive tape 211 at a central portion thereof. The circular adhesive tape 211 has a diameter larger than the diameter of the workpiece 200. A ring frame 210 having a circular inside opening 207 is attached to a peripheral portion of the adhesive tape 211. That is, the inside opening 207 of the ring frame 210 has a diameter smaller than the diameter of the adhesive tape 211. Accordingly, the workpiece 200 is supported through the adhesive tape 211 to the ring frame 210 in such a manner that the workpiece 200 is disposed in the inside opening 207 of the ring frame 210. In this preferred embodiment, the workpiece 200 is divided along the division lines 203 by the laser processing apparatus 1 to thereby obtain a plurality of individual device chips respectively including the plural devices 204.

(Laser Processing Apparatus)

As depicted in FIG. 1, the laser processing apparatus 1 includes a chuck table 10 having a holding surface 11 for holding the workpiece 200, a laser beam applying unit 20 for applying a laser beam to the workpiece 200 held on the holding surface 11 of the chuck table 10, a moving mechanism 30 as moving means for moving the chuck table 10 in the X direction depicted by an arrow X and in the Y direction depicted by an arrow Y and also moving the laser beam applying unit 20 in the Z direction depicted by an arrow Z, an imaging unit 90 for imaging the workpiece 200 held on the holding surface 11 of the chuck table 10, and a control unit 100 for controlling these components.

As mentioned above, the workpiece 200 is adapted to be held on the holding surface 11 of the chuck table 10. The holding surface 11 has a disk-shaped suction holding member formed of porous ceramic, for example. The suction holding member is connected through a suction passage (not depicted) to a vacuum source (not depicted) for producing a suction force. By applying this suction force to the suction holding member, the workpiece 200 placed on the holding surface 11 can be held under suction. In this preferred embodiment, the holding surface 11 is a horizontal surface parallel to an XY plane defined by the X direction and the Y direction. A plurality of clamps 12 are provided on the outer circumference of the chuck table 10, so as to hold the ring frame 210 supporting the workpiece 200 through the adhesive tape 211 in such a manner that the workpiece 200 is disposed in the inside opening 207 of the ring frame 210. The chuck table 10 is rotatable about its vertical axis extending in the Z direction by operating a rotating mechanism 13. The chuck table 10 and the rotating mechanism 13 are movable in the X direction by operating an X moving mechanism 40 and also movable in the Y direction by operating a Y moving mechanism 50, in which the X moving mechanism 40 and the Y moving mechanism 50 constitute the moving mechanism 30.

The laser beam applying unit 20 is a unit applying a pulsed laser beam 21 to the workpiece 200 held on the chuck table 10. As depicted in FIG. 2, the laser beam applying unit 20 includes a laser oscillator 22 for generating the laser beam 21 for processing the workpiece 200, a plurality of mirrors 23 for reflecting the laser beam 21 generated from the laser oscillator 22 toward the workpiece 200 held on the holding surface 11 of the chuck table 10, a focusing lens 24 for focusing the laser beam 21 reflected by the mirrors 23 to the workpiece 200, and focal position adjusting means (not depicted) for displacing a focal point 25 (see FIG. 2) of the laser beam 21 in the Z direction perpendicular to the holding surface 11 of the chuck table 10.

The wavelength of the laser beam 21 to be applied from the laser beam applying unit 20 may be a transmission wavelength to the workpiece 200 or may be an absorption wavelength to the workpiece 200. In this preferred embodiment, the focal point 25 is set on the upper surface (front side 202) of the workpiece 200 held on the holding surface 11 of the chuck table 10 in a horizontal plane parallel to both the X direction and the Y direction.

The mirrors 23 and the focusing lens 24 are optical components for guiding the laser beam 21 generated from the laser oscillator 22 to a processing point where the workpiece 200 is to be processed by the laser beam 21. Further, the laser beam applying unit 20 includes a plurality of mirror holders 26 as optical component holders for holding the plural mirrors 23, respectively, and a lens holder 27 as an optical component holder for holding the focusing lens 24. As depicted in FIG. 3, each mirror holder 26 includes an adjusting mechanism 261 for adjusting the position of the center 28 (depicted by a phantom line in FIG. 2) of the laser beam 21 on a photodetecting surface 71 of a position detecting unit 70 to be hereinafter described. Although not depicted in FIG. 3, the lens holder 27 also has an adjusting mechanism similar in function to the adjusting mechanism 261. The configuration of each mirror holder 26 will now be described with reference to FIG. 3, and the description of the lens holder 27 will therefore be omitted.

As depicted in FIG. 3, each mirror holder 26 includes the adjusting mechanism 261 mentioned above, a first plate 262 for holding the mirror 23, and a second plate 263 fixed to the laser processing apparatus 1. Each of the first plate 262 and the second plate 263 has an L-shaped configuration. The mirror 23 is held at a central portion of the first plate 262.

The adjusting mechanism 261 includes a spring 264 for connecting the first plate 262 and the second plate 263 and normally biasing the first plate 262 and the second plate 263 in such a direction that the first plate 262 and the second plate 263 approach each other. In this preferred embodiment, the first plate 262 and the second plate 263 are connected at their central portions by the spring 264. The adjusting mechanism 261 further includes a pair of adjusting screws 265 and 266 threadedly engaged with the second plate 263 at its opposite end portions. The front ends of the adjusting screws 265 and 266 abut against the first plate 262 at its opposite end portions. By rotating the adjusting screw 265 about its axis, the spacing between one end portion of the first plate 262 and one end portion of the second plate 263 can be adjusted. Similarly, by rotating the adjusting screw 266 about its axis, the spacing between the other end portion of the first plate 262 and the other end portion of the second plate 263 can be adjusted. As a result, the direction of the optical axis of each mirror 23 can be adjusted. In other words, the optical path of the laser beam 21 can be adjusted.

While the mirrors 23 and the focusing lens 24 are depicted as the optical components in this preferred embodiment, the optical components are not limited to the mirrors 23 and the focusing lens 24 in the present invention. Further, while the mirror holders 26 and the lens holder 27 are depicted as the optical component holders in this preferred embodiment, the optical component holders are not limited to the mirror holders 26 and the lens holder 27 in the present invention.

The moving mechanism 30 functions to relatively move the chuck table 10 and the laser beam applying unit 20. The moving mechanism 30 includes an X moving mechanism 40 as feeding means for moving the chuck table 10 in the X direction parallel to the holding surface 11, a Y moving mechanism 50 as indexing means for moving the chuck table 10 in the Y direction parallel to the holding surface 11 and perpendicular to the X direction, and a Z moving mechanism 60 for moving the laser beam applying unit 20 in the Z direction perpendicular to the holding surface 11.

The laser processing apparatus 1 has a box-shaped base housing 2. The X moving mechanism 40 and the Y moving mechanism 50 are provided on the upper surface of the base housing 2. More specifically, the X moving mechanism 40 functions to support an X movable plate 14 so that the X movable plate 14 is movable in the X direction. The rotating mechanism 13 for rotating the chuck table 10 about its axis extending in the Z direction is supported to the X movable plate 14. Accordingly, the chuck table 10 and the rotating mechanism 13 are movable with the X movable plate 14 in the X direction. The Y moving mechanism 50 functions to support a Y movable plate 15 so that the Y movable plate 15 is movable in the Y direction. The X movable plate 14 is movably supported to the Y movable plate 15.

An L-shaped column 3 is provided on the upper surface of the base housing 2. The Z moving mechanism 60 is provided on the L-shaped column 3. The Z moving mechanism 60 functions to support at least the focusing lens 24 of the laser beam applying unit 20 so that the laser beam applying unit 20 is movable in the Z direction. The X moving mechanism 40 includes a known ball screw 41 rotatable about its axis extending in the X direction, a known pulse motor 42 for rotating the ball screw 41 about its axis, and a pair of known guide rails 43 extending in the X direction and supporting the X movable plate 14 so that the X movable plate 14 can slide on the guide rails 43 in the X direction, in which the ball screw 41 is operatively engaged with the X movable plate 14, and the X movable plate 14 can be moved by the rotation of the ball screw 41. Similarly, the Y moving mechanism 50 includes a known ball screw 51 rotatable about its axis extending in the Y direction, a known pulse motor 52 for rotating the ball screw 51 about its axis, and a pair of known guide rails 53 extending in the Y direction and supporting the Y movable plate 15 so that the Y movable plate 15 can slide on the guide rails 53 in the Y direction, in which the ball screw 51 is operatively engaged with the Y movable plate 15, and the Y movable plate 15 can be moved by the rotation of the ball screw 51. Similarly, the Z moving mechanism 60 includes a known ball screw 61 rotatable about its axis extending in the Z direction, a known pulse motor 62 for rotating the ball screw 61 about its axis, and a pair of known guide rails 63 extending in the Z direction and supporting the laser beam applying unit 20 so that the laser beam applying unit 20 can slide on the guide rails 63 in the Z direction, in which the ball screw 61 is operatively engaged with the laser beam applying unit 20 so that the laser beam applying unit 20 can slide on the guide rails 63 in the Z direction.

Further, the laser processing apparatus 1 includes an X position detecting unit (not depicted) for detecting the X position of the chuck table 10 in the X direction, a Y position detecting unit (not depicted) for detecting the Y position of the chuck table 10 in the Y direction, and a Z position detecting unit (not depicted) for detecting the Z position of the focusing lens 24 of the laser beam applying unit 20 in the Z direction. The result of detection by each position detecting unit is output to the control unit 100.

The imaging unit 90 functions to image the workpiece 200 held on the chuck table 10. For example, the imaging unit 90 is configured by a charge coupled device (CCD) camera or an infrared camera capable of imaging the workpiece 200 held on the chuck table 10. In this preferred embodiment, the imaging unit 90 is fixed to the laser beam applying unit 20 at a position adjacent to the focusing lens 24. The workpiece 200 is imaged by the imaging unit 90 to obtain an image for use in performing alignment for making the alignment between the workpiece 200 and the laser beam applying unit 20. The image obtained by the imaging unit 90 is output to the control unit 100.

The control unit 100 functions to control the above-mentioned components of the laser processing apparatus 1 and thereby perform a laser processing operation to the workpiece 200. The control unit 100 is configured by a computer including a computing unit having a microprocessor such as a central processing unit (CPU), a storing unit having a memory such as a read only memory (ROM) and a random access memory (RAM), and an input/output interface unit. The computing unit in the control unit 100 performs computation according to a computer program stored in the storing unit and then outputs a control signal for controlling the laser processing apparatus 1 through the input/output interface unit to each component of the laser processing apparatus 1, thus realizing the function of the control unit 100.

Further, the laser processing apparatus 1 includes a display unit 101 such as a liquid crystal display for displaying the condition of the laser processing operation and the image obtained by the imaging unit 90 and an input unit (not depicted) for use in recording information on the details of laser processing from an operator. The display unit 101 and the input unit are connected to the control unit 100. The input unit is configured by either or both of a touch panel provided in the display unit 101 and an external input device such as a keyboard. The display unit 101 has a display screen 102 on which the information or image is displayed. By operating the input unit, the condition of the display screen 102 can be changed.

As depicted in FIG. 1, the control unit 100 is connectable to a position detecting unit 70. The position detecting unit 70 has a photodetecting surface 71 for receiving the laser beam 21 generated from the laser oscillator 22 and then guided by the mirrors 23 and the focusing lens 24. In this preferred embodiment, the position detecting unit 70 is configured by a power meter having a pointing function capable of detecting the position of the laser beam 21 on the photodetecting surface 71. However, the position detecting unit 70 may be configured by a profiler in the present invention. Information on the position of the laser beam 21 on the photodetecting surface 71 as detected is output from the position detecting unit 70 to the control unit 100. In this preferred embodiment, the photodetecting surface 71 has a square shape as viewed in plan. However, the shape of the photodetecting surface 71 is not limited in the present invention.

Prior to performing the laser processing operation to the workpiece 200 by using the laser processing apparatus 1, the adjusting mechanism 261 of each of the holders 26 and 27 is operated to thereby adjust the position of the laser beam 21. In performing the laser processing operation, the information on the details of laser processing is first recorded by the operator into the memory in the control unit 100. Thereafter, the workpiece 200 supported through the adhesive tape 211 to the ring frame 210 is placed through the adhesive tape 211 on the holding surface 11 of the chuck table 10. That is, the front side 202 of the workpiece 200 held on the chuck table 10 is oriented upward. Thereafter, the control unit 100 receives an instruction to start the laser processing apparatus 1 from the operator through the input unit. Accordingly, the control unit 100 starts the laser processing operation according to the information on the details of laser processing as recorded previously.

In the laser processing operation, a suction force produced by the vacuum source is applied to the holding surface 11 of the chuck table 10. As a result, the workpiece 200 is held under suction through the adhesive tape 211 on the holding surface 11 of the chuck table 10. Thereafter, the ring frame 210 is fixed by the clamps 12. Thereafter, the moving mechanism 30 is operated to move the chuck table 10 to a position below the imaging unit 90, and the imaging unit 90 is next operated to image the workpiece 200 held on the chuck table 10. Thereafter, the control unit 100 performs image processing such as pattern matching by using an image obtained by the imaging unit 90, so as to make the alignment between a target one of the division lines 203 of the workpiece 200 held on the chuck table 10 and the focusing lens 24 of the laser beam applying unit 20. Thus, alignment is performed.

Thereafter, the laser beam applying unit 20 is operated to apply the pulsed laser beam 21 to the workpiece 200 as the laser beam applying unit 20 and the workpiece 200 are relatively moved in the X direction by operation of the moving mechanism 30. More specifically, the X moving mechanism 40 is operated to move the chuck table 10 with respect to the laser beam applying unit 20 in the X direction. Accordingly, the workpiece 200 is processed along the target division line 203 by the laser beam 21. Thereafter, the X moving mechanism 40, the Y moving mechanism 50, and the rotating mechanism 13 are operated to similarly perform the laser processing operation along all of the other division lines 203. Thereafter, the application of the laser beam 21 is stopped to finish the laser processing operation.

In general, such a laser processing operation to the workpiece 200 may cause the occurrence of contamination or burning on the optical components including the mirrors 23 and the focusing lens 24 due to the laser beam 21. The occurrence of contamination or burning may cause a reduction in power of the laser beam 21 or a distortion in beam shape (power distribution) of the laser beam 21. Owing to such a reduction in power of the laser beam 21 or a distortion in beam shape (power distribution) of the laser beam 21, there is a possibility that the workpiece 200 cannot be desirably processed to cause defective processing. When such defective processing occurs, the laser processing operation is once stopped and the optical components including the mirrors 23 and the focusing lens 24 of the laser beam applying unit 20 are next demounted one by one for the purpose of maintenance work such as cleaning and replacement. After finishing the maintenance work, the laser processing operation to the workpiece 200 is restarted.

(Optical Axis Adjusting Method)

The optical axis adjusting method according to this preferred embodiment is a method of adjusting the optical path of the laser beam 21 to be applied from the laser beam applying unit 20 in the laser processing apparatus 1. This method is also a maintenance method for the optical components including the mirrors 23 and the focusing lens 24 of the laser beam applying unit 20. As depicted in FIG. 4, the optical axis adjusting method according to this preferred embodiment includes a position detecting unit setting step ST1, position detecting step ST2, storing step ST3, component adjusting step ST4, and optical axis adjusting step ST5.

(Position Detecting Unit Setting Step)

Figure 5:
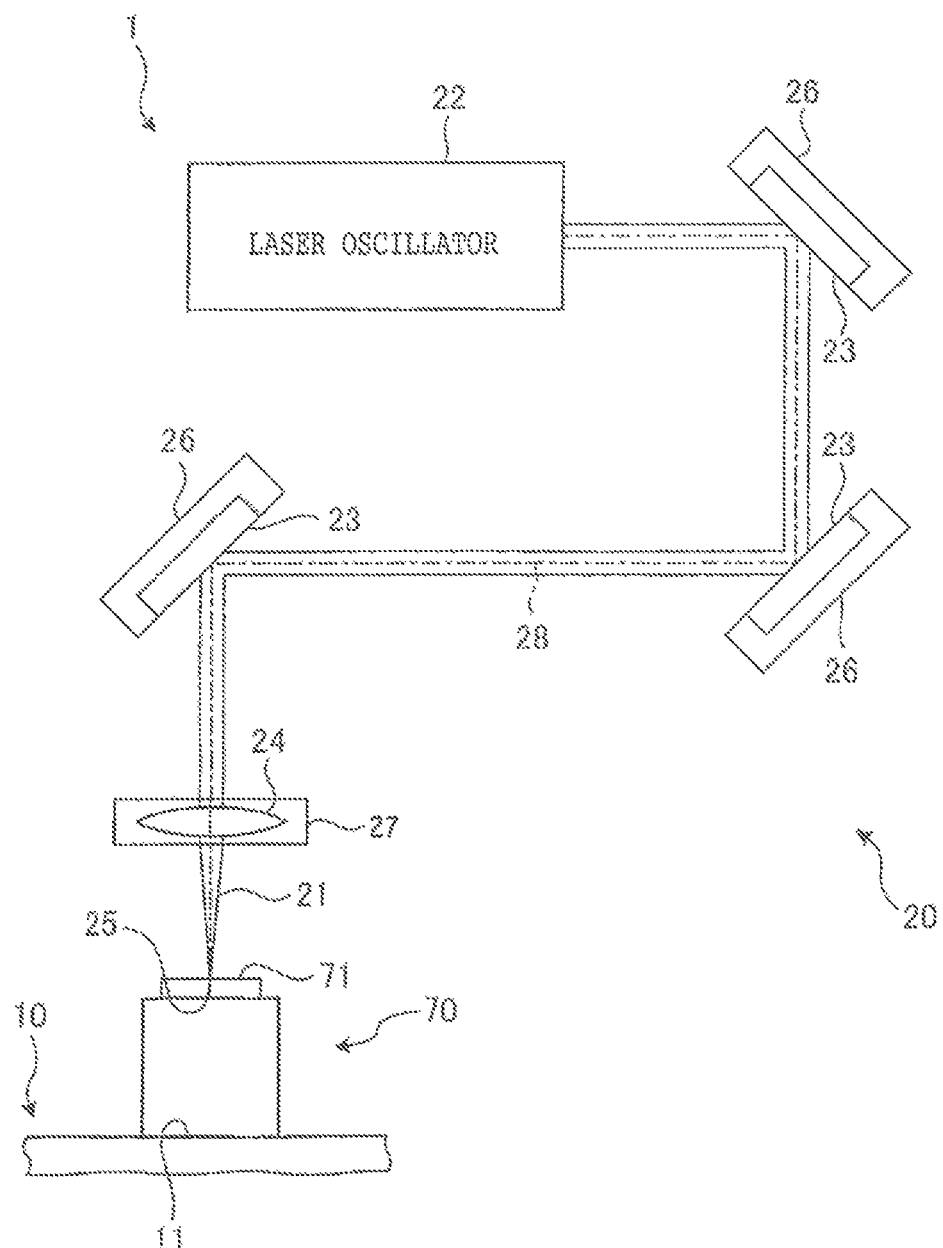
FIG. 5 is a schematic diagram depicting the outline of a position detecting unit setting step included in the optical axis adjusting method depicted in FIG. 4.

FIG. 5 is a schematic diagram depicting the outline of the position detecting unit setting step of the optical axis adjusting method depicted in FIG. 4. The position detecting unit setting step ST1 is a step of setting the position detecting unit 70 for detecting the position of the laser beam 21 at a predetermined processing point before performing the maintenance of each optical component.

In the position detecting unit setting step ST1, the position detecting unit 70 is connected to the control unit 100 by the operator and next set at a predetermined position as the predetermined processing point as depicted in FIG. 5 by the operator. In this preferred embodiment, this predetermined position is defined as the center of the holding surface 11 of the chuck table 10. However, the predetermined position is not limited to the center of the holding surface 11 in the present invention. After setting the position detecting unit 70 at the center of the holding surface 11, the method proceeds to the position detecting step ST2.

(Position Detecting Step)

Figure 6:
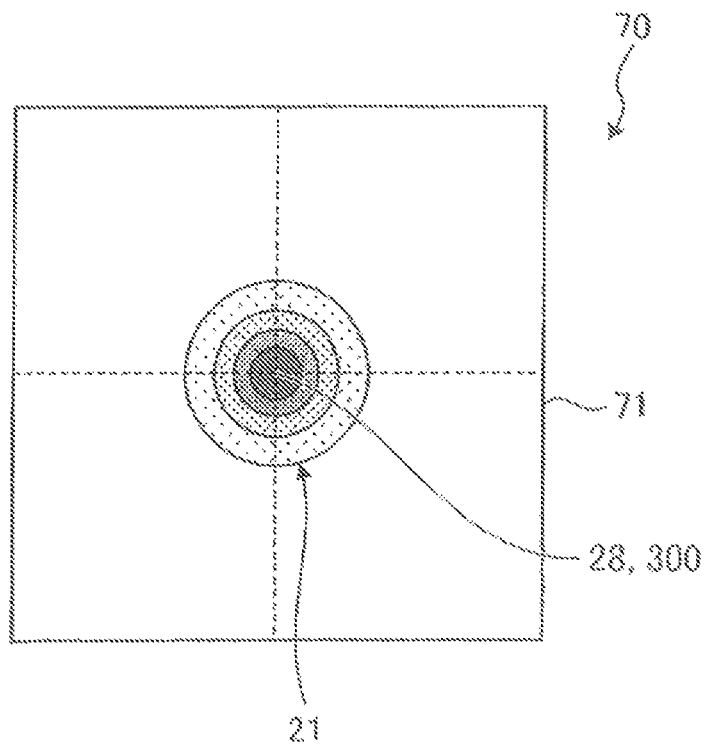
FIG. 6 is a schematic plan view of a photodetecting surface on which the position of a laser beam is detected by a position detecting unit in a position detecting step included in the optical axis adjusting method depicted in FIG. 4.

FIG. 6 is a schematic plan view of the photodetecting surface 71 on which the position of the laser beam 21 is detected by the position detecting unit 70 in the position detecting step of the optical axis adjusting method depicted in FIG. 4. The position detecting step ST2 is a step of generating the laser beam 21 from the laser oscillator 22 and applying the laser beam 21 to the predetermined processing point, i.e., to the photodetecting surface 71 of the position detecting unit 70 set on the holding surface 11 at the center thereof as the predetermined position, thereby detecting the position of the laser beam 21, prior to performing the maintenance of each optical component.

In the position detecting step ST2, the input unit is operated by the operator to start the operation of the laser processing apparatus 1. Accordingly, the moving mechanism 30 is operated to relatively move the laser beam applying unit 20 and the chuck table 10 so that the focusing lens 24 of the laser beam applying unit 20 is vertically opposed to the photodetecting surface 71 of the position detecting unit 70 set on the holding surface 11 of the chuck table 10 in the Z direction. Thereafter, the laser beam 21 is generated from the laser oscillator 22 and then applied to the photodetecting surface 71 of the position detecting unit 70. That is, the laser beam 21 applied from the laser beam applying unit 20 is received by the photodetecting surface 71.

Thereafter, the position of the laser beam 21 on the photodetecting surface 71 depicted in FIG. 6 is detected by the position detecting unit 70. Thereafter, information indicating the position of the laser beam 21 on the photodetecting surface 71 as detected above is output to the control unit 100. Thereafter, the method proceeds to the storing step ST3.

(Storing Step)

The storing step ST3 is a step of storing the position of the laser beam 21 on the photodetecting surface 71 as detected in the position detecting step ST2, as a reference position 300 (see FIG. 6). In the storing step ST3, the control unit 100 stores into the memory the position of the laser beam 21 on the photodetecting surface 71 as detected above as the reference position 300. That is, the detected position of the laser beam 21 on the photodetecting surface 71 as the reference position 300 is stored into the memory of the control unit 100. Further, the position of the chuck table 10, i.e., the position of the position detecting unit 70 as positioned in the position detecting step ST2 is also stored into the memory of the control unit 100. Thereafter, the method proceeds to the component adjusting step ST4.

In FIG. 6, the laser beam 21 is applied to the center of the photodetecting surface 71 in the position detecting step ST2, so that the center of the photodetecting surface 71 is stored as the position of the laser beam 21, i.e., the reference position 300. Further, in FIG. 6, the beam spot of the laser beam 21 formed on the photodetecting surface 71 has a circular shape and depicts a Gaussian distribution such that the nearer to the center 28 of the laser beam 21, the larger the power of the laser beam 21. Further, in the position detecting step ST2 and the storing step ST3, the position of the laser beam 21 on the photodetecting surface 71 of the position detecting unit 70 may be displayed on the display screen 102 of the display unit 101.

(Component Adjusting Step)

The component adjusting step ST4 is a step of removing one of the plural mirrors 23 and the focusing lens 24, i.e., one of the plural optical components of the laser beam applying unit 20 after performing the storing step ST3, next performing the maintenance of the optical component removed above, e.g., cleaning or replacement of the optical component removed above, and next mounting the optical component again to the laser beam applying unit 20 after performing the maintenance. That is, in the component adjusting step ST4, one of the plural optical components of the laser beam applying unit 20 is first removed by the operator. Thereafter, the maintenance work is performed to this optical component removed. Thereafter, this optical component is mounted again to the laser beam applying unit 20 by the operator. Thereafter, the method proceeds to the optical axis adjusting step ST5.

(Optical Axis Adjusting Step)

Figure 7:
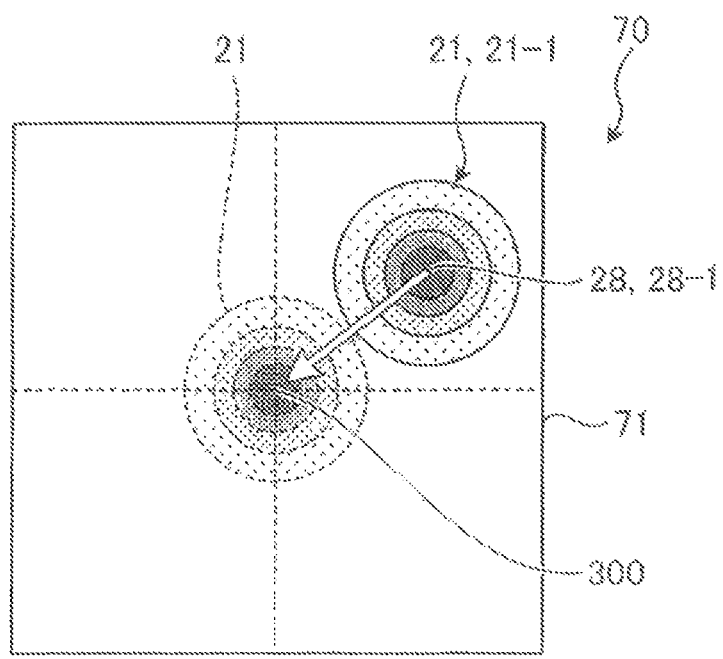
FIG. 7 is a schematic plan view similar to FIG. 6, depicting an optical axis adjusting step included in the optical axis adjusting method depicted in FIG. 4.

FIG. 7 is a schematic plan view of the photodetecting surface 71 on which the position of the laser beam 21 is detected by the position detecting unit 70 in the optical axis adjusting step of the optical axis detecting method depicted in FIG. 4. The optical axis adjusting step ST5 is a step of generating the laser beam 21 from the laser oscillator 22 and then applying the laser beam 21 to the photodetecting surface 71 of the position detecting unit 70 set at the predetermined position on the holding surface 11 as the predetermined processing point, thereby detecting the position of the laser beam 21 on the photodetecting surface 71, after performing the maintenance of the one optical component as mentioned above.

After performing the maintenance of the one optical component, there is a possibility that the position of the laser beam 21 on the photodetecting surface 71 as detected by the position detecting unit 70 may be deviated from the reference position 300 as depicted in FIG. 7. In this case, in the optical axis adjusting step ST5, the adjusting mechanism 261 of the optical component holder for holding the one optical component subjected to the maintenance work is operated to shift the position of the laser beam 21 back to the reference position 300, thereby adjusting the optical path of the laser beam 21.

In the optical axis adjusting step ST5, the input unit is operated by the operator to restart the laser processing apparatus 1. Accordingly, the moving mechanism 30 is operated to move the chuck table 10 to the same position as that set in the position detecting step ST2. Thereafter, the laser beam 21 is generated from the laser oscillator 22 and applied to the photodetecting surface 71 of the position detecting unit 70 set on the holding surface 11 of the chuck table 10 at the predetermined position.

Thereafter, the position of the laser beam 21 on the photodetecting surface 71 depicted in FIG. 7 is detected by the position detecting unit 70 after performing the maintenance work. In FIG. 7, the beam spot of the laser beam 21 on the photodetecting surface 71 after performing the maintenance work is denoted by reference numeral 21-1. Thereafter, information depicting the position of the laser beam 21-1 on the photodetecting surface 71 as detected above is output to the control unit 100. As apparent from FIG. 7, the beam spot of the laser beam 21-1 is deviated from the beam spot of the laser beam 21 at the reference position 300.

Thereafter, the display unit 101 is controlled by the control unit 100 to display the position of the laser beam 21-1 on the photodetecting surface 71 of the position detecting unit 70 as detected above and the reference position 300 previously stored. That is, the position of the laser beam 21-1 and the reference position 300 are displayed on the display screen 102 of the display unit 101. As depicted in FIG. 7, the position of the laser beam 21-1 is deviated from the reference position 300. In this case, the adjusting mechanism 261 of the optical component holder for holding the optical component subjected to the maintenance work is operated to shift the position of the laser beam 21-1 back to the reference position 300 as depicted by a white arrow in FIG. 7.

In the optical axis adjusting step ST5, the position of the laser beam 21 on the photodetecting surface 71 of the position detecting unit 70 as detected in the position detecting step ST2 may be displayed on the display screen 102 of the display unit 101. Further, the center 28-1 of the laser beam 21-1 may also be displayed on the display screen 102 of the display unit 101.

After performing the optical axis adjusting step ST5, the method proceeds to step ST6, in which it is determined whether or not the maintenance work has been performed for all of desired ones of the plural optical components of the laser beam applying unit 20 by the operator. If the maintenance work has not been performed for all of the desired optical components by the operator (step ST6: No), the method returns to the component adjusting step ST4 to perform the maintenance work for one of the desired optical components, and the optical axis adjusting step ST6 is next performed. In this manner, the component adjusting step ST4 and the optical axis adjusting step ST5 are repeated until the maintenance work is performed for all of the other desired optical components by the operator. As a result, when the maintenance work has been performed for all of the desired optical components of the laser beam applying unit 20 by the operator (step ST6: Yes), the method is ended.

As described above, the optical axis adjusting method according to this preferred embodiment includes the position detecting step ST2, in which the focusing lens 24 of the laser beam applying unit 20 is opposed to the photodetecting surface 71 of the position detecting unit 70, and the laser beam 21 is applied to the photodetecting surface 71 before performing the maintenance work for each optical component. Then, the position of the laser beam 21 on the photodetecting surface 71 is detected and stored as the reference position 300. Accordingly, after removing the optical components, next performing the maintenance work, and next mounting the optical components again, the amount of deviation of the position of the laser beam 21 after maintenance work from the reference position 300 can be easily recognized by checking the result of detection by the position detecting unit 70.

In the case of removing the mirror 23 located just downstream of the beam outlet opening of the laser oscillator 22 in the laser processing apparatus 1 having a complex optical system composed of plural optical components, it is only necessary to operate the adjusting mechanism 261 of the optical component holder for holding the mirror 23 removed, thereby adjusting the position of the laser beam 21. That is, it is unnecessary to perform the adjustment of the optical axes of all the other optical components located downstream of the mirror 23. Accordingly, the number of man-hours can be greatly reduced. As a result, the optical axis adjusting method according to this preferred embodiment can exhibit an effect that the number of man-hours required for the adjustment of the optical path of the laser beam 21 can be suppressed.

(Modification)

Figure 8:
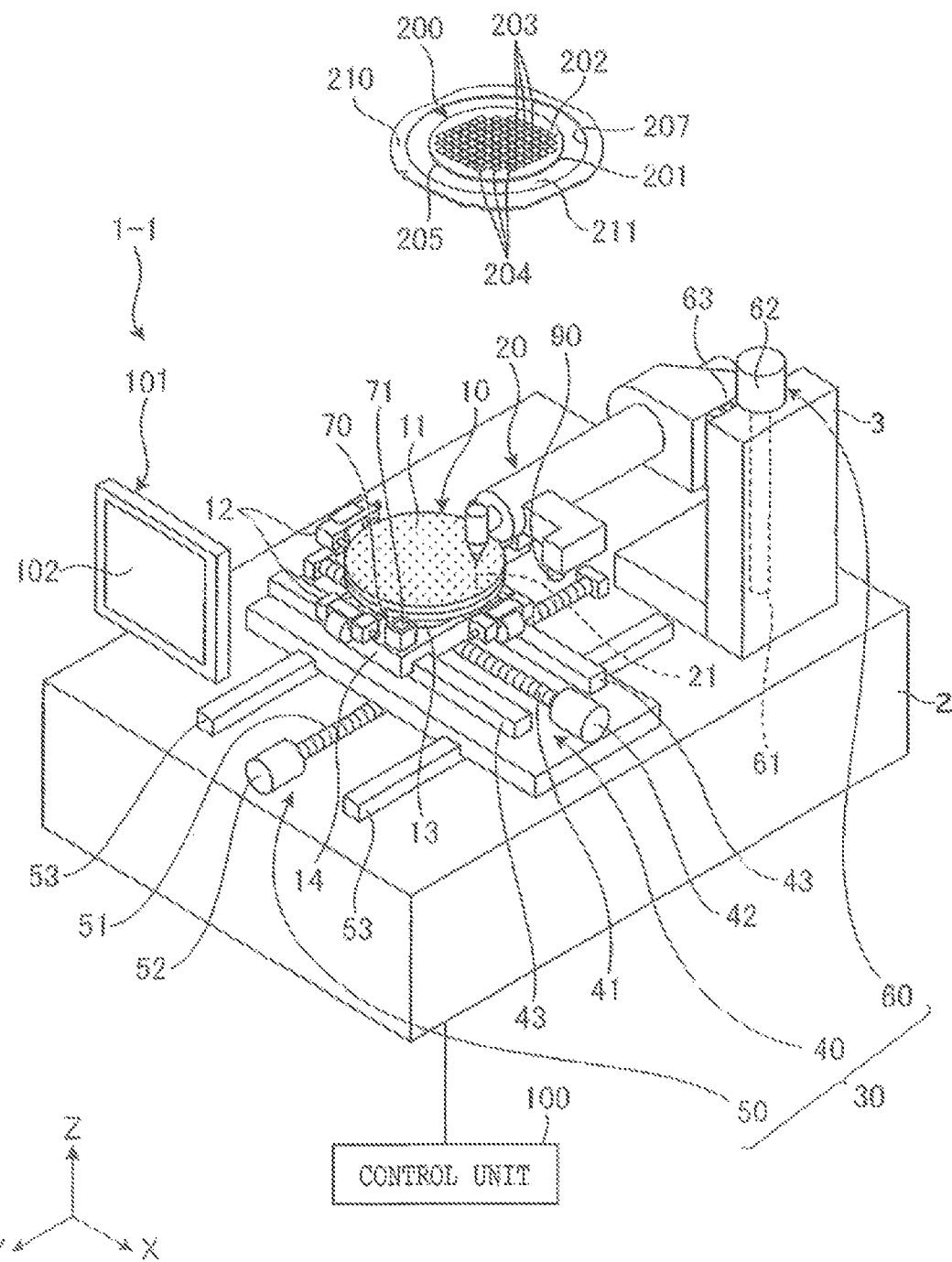
FIG. 8 is a perspective view similar to FIG. 1, depicting a modification of this preferred embodiment.

An optical axis adjusting method according to a modification of the above preferred embodiment will now be described with reference to FIG. 8. FIG. 8 is a perspective view depicting the configuration of a laser processing apparatus 1-1 for use in performing the optical axis adjusting method according to this modification. In FIG. 8, the same parts as those depicted in FIG. 1 are denoted by the same reference numerals, and the description thereof will therefore be omitted.

As depicted in FIG. 8, the position detecting unit 70 is previously located on the X movable plate 14 in the laser processing apparatus 1-1 at a predetermined position corresponding to the predetermined processing point. That is, the position detecting unit setting step ST1 in the above preferred embodiment is not performed in this modification. Further, in the position detecting step ST2 and the optical axis adjusting step ST5, the focusing lens 24 of the laser beam applying unit 20 is opposed to the photodetecting surface 71 of the position detecting unit 70 set on the X movable plate 14 in the Z direction. The other configuration is similar to that in the above preferred embodiment.

In the position detecting step ST2 of the optical axis adjusting method according to this modification, the focusing lens 24 of the laser beam applying unit 20 is opposed to the photodetecting surface 71 of the position detecting unit 70 in the Z direction. Thereafter, the laser beam 21 is generated and applied to the photodetecting surface 71, and the position of the laser beam 21 on the photodetecting surface 71 is detected and stored as the reference position 300, before performing the maintenance work for each optical component. Accordingly, this modification can exhibit a similar effect that the number of man-hours required for the adjustment of the optical path of the laser beam 21 can be suppressed.

Further, in the optical axis adjusting method according to this modification, the position detecting unit 70 is previously located on the X movable plate 14. Accordingly, in adjusting the optical path of the laser beam 21, there is no need for time and effort for providing the position detecting unit 70 on the holding surface 11 of the chuck table 10. Accordingly, the effect of suppressing the number of man-hours required for the adjustment of the optical axis in the laser processing apparatus can be made greater.

The present invention is not limited to the above preferred embodiment, and various modifications may be made without departing from the scope of the present invention. For example, before any defective processing occurs, the position detecting unit setting step ST1, the position detecting step ST2, and the storing step ST3 may be performed to detect and store the reference position 300.

The present invention is not limited to the details of the above described preferred embodiment. The scope of the invention is defined by the appended claims and all changes and modifications as fall within the equivalence of the scope of the claim are therefore to be embraced by the invention.

What is claimed is:

1. An optical axis adjusting method for a laser processing apparatus including a laser beam applying unit, said laser beam applying unit including:
   a laser oscillator for oscillating a laser and emitting a laser beam;
   a plurality of optical components for guiding said laser beam generated from said laser oscillator to a processing point where a workpiece is to be processed by said laser beam;
   a plurality of optical component holders for holding said plurality of optical components, respectively, each optical component holder having an adjusting mechanism for adjusting a position of said laser beam;
   a position detecting unit adapted to be provided at said processing point for detecting said position of said laser beam; and
   a controller connected to the position detecting unit and a display, and configured to control the laser beam applying unit,
   said optical axis adjusting method comprising:
      a position detecting step including emitting said laser beam from said laser oscillator, applying said laser beam to said processing point, and detecting a first position of said laser beam by using said position detecting unit set at said processing point;
      a storing step including storing said first position of said laser beam as detected in said position detecting step as a reference position in a memory of the controller;
      a maintenance step including removing at least one of said optical components from a corresponding associated optical component holder, subsequently performing maintenance on the optical component or components removed, and then mounting the removed optical component or a replacement optical component on the associated optical component holder;
      a beam spot position detecting step including emitting said laser beam from said laser oscillator, applying said laser beam to said processing point, and detecting a second beam spot position of said laser beam by using said position detecting unit set at said processing point, wherein said beam spot position detecting step is performed after performing the position detecting step, the storing step and the maintenance step;

a determining step including comparing the second beam spot position detected during the beam spot position detecting step with the reference position saved during the storing step by the controller controlling the second beam spot position and the reference position to show on the display; and an adjusting step including operating said adjusting mechanism of each optical component holder to adjust the second position of said laser beam to shift back to said reference position from any deviated position.

2. The optical axis adjusting method according to claim 1, wherein the position detecting unit includes a photodetecting surface, and further wherein the laser beam emitted during the position detecting step is applied to the photodetecting surface.

3. The optical axis adjusting method according to claim 2, wherein the position detecting unit comprises a power meter having a pointing function capable of detecting the position of the laser beam on the photodetecting surface.

4. The optical axis adjusting method according to claim 2, wherein the position detecting unit comprises a profiler.

5. The optical axis adjusting method according to claim 2, wherein the laser processing apparatus includes a chuck table that is seated upon a movable plate, and further wherein the position detecting unit is positioned upon a holding surface of the chuck table during the position detecting step.

6. The optical axis adjusting method according to claim 2, wherein the laser processing apparatus includes a chuck table that is seated upon a movable plate, and further wherein the position detecting unit is positioned upon the movable plate during the position detecting step.

7. The optical axis adjusting method according to claim 1, wherein the optical components comprise mirrors for guiding the laser beam generated from said laser oscillator to the processing point.

8. The optical axis adjusting method according to claim 1, wherein the optical components comprise lenses for guiding the laser beam generated from said laser oscillator to the processing point.

9. The optical axis adjusting method according to claim 1, wherein the optical components comprise a combination of mirrors and a focusing lens, and wherein the combination of the mirrors and the focusing lens is configured and arranged for guiding the laser beam generated from said laser oscillator to the processing point.

10. The optical axis adjusting method according to claim 1, wherein the laser processing apparatus includes a chuck table that is seated upon a movable plate, and further wherein the position detecting unit is positioned upon a holding surface of the chuck table during the position detecting step.

11. The optical axis adjusting method according to claim 1, wherein the laser processing apparatus includes a chuck table that is seated upon a movable plate, and further wherein the position detecting unit is positioned upon the movable plate during the position detecting step.

12. The optical adjusting method according to claim 1, wherein the performing maintenance on the optical component or components involves cleaning the optical component or components removed during the maintenance step.

13. The optical adjusting method according to claim 1, wherein the maintenance step is performed on all of the optical components associated with the laser beam applying unit.

14. An optical axis adjusting method for a laser processing apparatus including a laser beam applying unit, said laser beam applying unit including:

a laser oscillator for oscillating a laser and emitting a laser beam;

a plurality of optical components for guiding said laser beam generated from said laser oscillator to a processing point where a workpiece is to be processed by said laser beam;

a plurality of optical component holders for holding said plurality of optical components, respectively, each optical component holder having an adjusting mechanism for adjusting a position of said laser beam;

a position detecting unit adapted to be provided at said processing point for detecting said position of said laser beam; and a controller connected to the position detecting unit and a display, and configured to control the laser beam applying unit, said optical axis adjusting method comprising:

a position detecting step including emitting said laser beam from said laser oscillator, applying said laser beam to said processing point, and detecting a first position of said laser beam by using said position detecting unit set at said processing point;

a storing step including storing said first position of said laser beam as detected in said position detecting step as a reference position in a memory of the controller;

a maintenance step including removing at least one of said optical components from a corresponding associated optical component holder, subsequently performing maintenance on the optical component or components removed, and then mounting the removed optical component or a replacement optical component on the associated optical component holder;

a beam spot position detecting step including emitting said laser beam from said laser oscillator, applying said laser beam to said processing point, and detecting a second beam spot position of said laser beam by using said position detecting unit set at said processing point, wherein said beam spot position detecting step is performed after performing the position detecting step, the storing step and the maintenance step;

a determining step including comparing the second beam spot position detected during the beam spot position detecting step with the reference position saved during the storing step by the controller controlling the second beam spot position and the reference position to show on the display; and an adjusting step including operating said adjusting mechanism of at least one of said optical component holders to adjust the second position of said laser beam to shift back to said reference position from any deviated position.

* * * * *